US006790736B2

(12) United States Patent
Wu

(10) Patent No.: US 6,790,736 B2
(45) Date of Patent: Sep. 14, 2004

(54) METHOD FOR MANUFACTURING AND STRUCTURE OF SEMICONDUCTOR DEVICE WITH POLYSILICON DEFINITION STRUCTURE

(75) Inventor: Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 09/997,972

(22) Filed: Nov. 29, 2001

(65) Prior Publication Data

US 2003/0100149 A1 May 29, 2003

(51) Int. Cl.⁷ .............................................. H01L 21/331
(52) U.S. Cl. ...................................... 438/316; 438/586
(58) Field of Search .................................. 438/309, 586, 438/316; 257/316

(56) References Cited

U.S. PATENT DOCUMENTS 5,717,241 A * 2/1998 Malhi et al. ................ 257/378

OTHER PUBLICATIONS

Wolf, S.; Silicon Processing for the VLSI Era vol. 3: The Submicron MOSFET, Sunset Beach, CA, 1995, pp. 634–635.*

* cited by examiner

Primary Examiner—John F. Niebling
Assistant Examiner—Christopher Lattin
(74) Attorney, Agent, or Firm—Rose Alyssa Keagy; W. James Brady, III; Frederick J. Telecky, Jr.

(57) ABSTRACT

In accordance with a particular embodiment of the present invention, a method for manufacturing a semiconductor device includes forming a buried layer of a semiconductor substrate. An active region is formed adjacent at least a portion of the buried layer, and an isolation structure is formed adjacent at least a portion of the active region. A gate oxide is formed adjacent at least a portion of the active region. The method also includes forming a polysilicon layer adjacent at least a portion of the gate oxide. At least a portion of the polysilicon layer is removed to form a polysilicon definition structure. The polysilicon definition structure at least substantially surrounds and defines an emitter contact region. The method also includes forming an implant region of the emitter contact region, wherein the implant region is self-aligned.

10 Claims, 3 Drawing Sheets

METHOD FOR MANUFACTURING AND STRUCTURE OF SEMICONDUCTOR DEVICE WITH POLYSILICON DEFINITION STRUCTURE

TECHNICAL FIELD OF THE INVENTION

This invention relates generally to semiconductor devices and, more specifically, to a semiconductor device with a polysilicon definition structure and a method for manufacturing the same.

BACKGROUND OF THE INVENTION

The demand for semiconductor devices to be made smaller is ever present because size reduction typically increases speed and performance. Moreover, reduction of the size of components of semiconductor devices can also increase packing density, allowing a manufacturer to produce wafers having more components.

In some conventional semiconductor devices, an emitter contact region is either aligned to a shallow trench or local oxidation on silicon isolation structure or is defined by a photoresist in a non-self-aligned manner. Such methods can make it difficult to control the width of the emitter contact region and difficult to control the distance between the emitter contact region and a base contact region. Furthermore, misalignment during a silicide block process can decrease the reliability of the device.

SUMMARY OF THE INVENTION

The present invention provides a semiconductor device and method for manufacturing the same that substantially eliminates or reduces at least some of the disadvantages and problems associated with the previously developed semiconductor devices and methods for manufacturing the same.

In accordance with a particular embodiment of the present invention, a method for manufacturing a semiconductor device includes forming a buried layer of a semiconductor substrate. An active region is formed adjacent at least a portion of the buried layer, and an isolation structure is formed adjacent at least a portion of the active region. A gate oxide is formed adjacent at least a portion of the active region. The method also includes forming a polysilicon layer adjacent at least a portion of the gate oxide. At least a portion of the polysilicon layer is removed to form a polysilicon definition structure. The polysilicon definition structure at least substantially surrounds and defines an emitter contact region. The method also includes forming an implant region of the emitter contact region, wherein the implant region is self-aligned.

In accordance with another embodiment, a semiconductor device includes a buried layer of a semiconductor substrate. An active region is adjacent at least a portion of the buried layer, and an isolation structure is adjacent at least a portion of the active region. A gate oxide is adjacent at least a portion of the active region. A polysilicon definition structure is adjacent at least a portion of the gate oxide. The polysilicon definition structure at least substantially surrounds and defines an emitter contact region. The semiconductor device includes an implant region of the emitter contact region, wherein the implant region is self-aligned during formation.

Technical advantages of particular embodiments of the present invention include a semiconductor device with a polysilicon definition structure which enables a manufacturer to more easily control and reduce a width of an emitter contact region of the device. The polysilicon definition structure also enables a manufacturer to reduce the distance between the emitter contact region and a base contact region of the device. Accordingly, such width and distance reductions can increase the unit-to-gain frequency of the semiconductor. Furthermore, manufacturing packing density can be improved since more semiconductor devices may be able to fit on a wafer of a given size.

Another technical advantage of particular embodiments of the present invention includes a semiconductor device with self-aligned implant regions as a result of having a polysilicon definition structure. Furthermore, a silicide block may not be required since the polysilicon definition structure can act as such a block during silicidation. Accordingly, the number of masking steps needed in the manufacturing of the semiconductor device can be reduced which leads to a reduction in time and costs associated with the manufacturing of the device.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
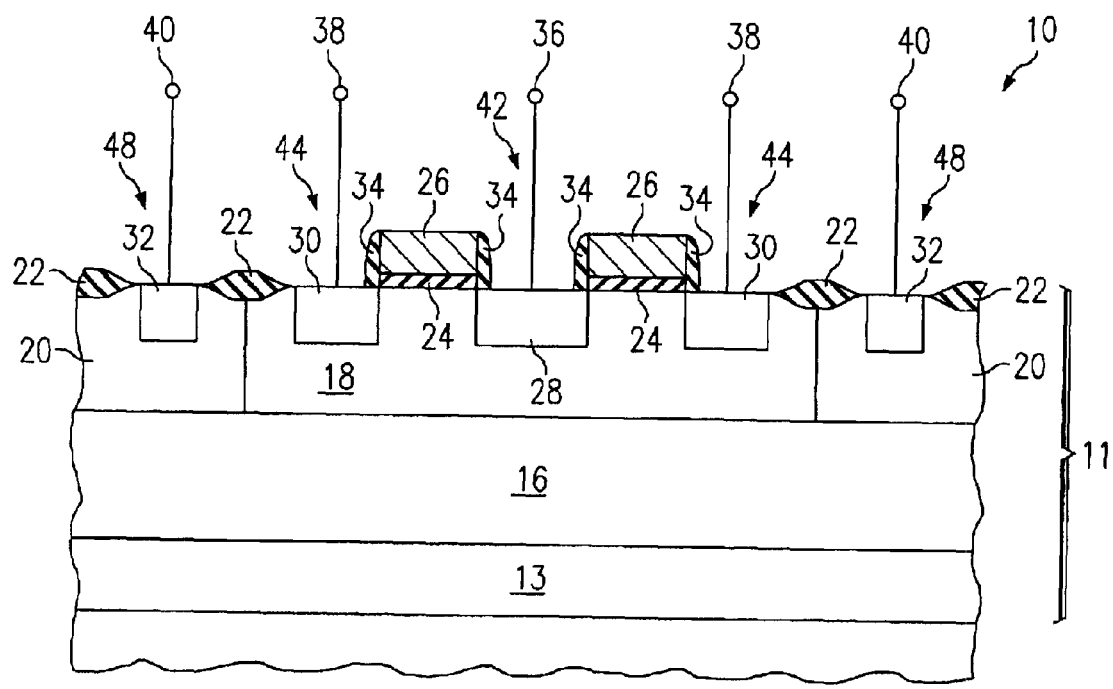
FIG. 1 is a cross-sectional diagram illustrating a semiconductor device with a polysilicon definition structure at one stage of a manufacturing process, in accordance with a particular embodiment of the present invention.

FIG. 1 illustrates a semiconductor device 10 at one stage of a manufacturing process, in accordance with an embodiment of the present invention. Semiconductor device 10 includes a polysilicon definition structure 26 formed using methods of the present invention. Polysilicon definition structure 26 substantially surrounds an emitter contact region 42 (as further illustrated in FIG. 5).

The formation of polysilicon definition structure 26 allows a manufacturer to form an emitter contact region 42 of semiconductor device 10 with a reduced width that is more easily controlled. Furthermore, the distance between the emitter contact region 42 and a base contact region 44 can be reduced and better-controlled as well. Such reductions can increase the unit-to-gain frequency ("$F_t$") of semiconductor device 10.

The formation of semiconductor device 10 with polysilicon definition structure 26 may also require less masking steps to complete the manufacturing process since a silicide block may not be needed when contact regions of semiconductor device 10 are silicided during the manufacturing process. This is because polysilicon definition structure 26 can act as a block during silicidation. This can reduce the amount of time it takes to manufacture semiconductor device 10 and can also reduce the cost of manufacturing a semiconductor device. Other advantages to the formation of polysilicon definition structure 26 of semiconductor device 10 in accordance with particular embodiments of the present invention are discussed below, while further advantages will be readily apparent to one skilled in the art.

Semiconductor device 10 includes semiconductor substrate 11 which comprises a wafer 13. As discussed in greater detail below, in this embodiment semiconductor substrate 11 also includes a buried layer 16 and an active region 18 disposed adjacent buried layer 16. Well region 20 is adjacent a portion of active region 18. Buried layer 16 and well region 20 form a collector of semiconductor device 10. Isolation structures 22 are also adjacent a portion of active region 18. Semiconductor device 10 also includes implant regions 28, 30 and 32. Polysilicon definition structure 26 is disposed upon a gate oxide 24. Spacer structures 34 are adjacent polysilicon definition structure 26. Semiconductor device 10 also includes emitter contact 36, base contacts 38 and collector contacts 40.

Figure 2:
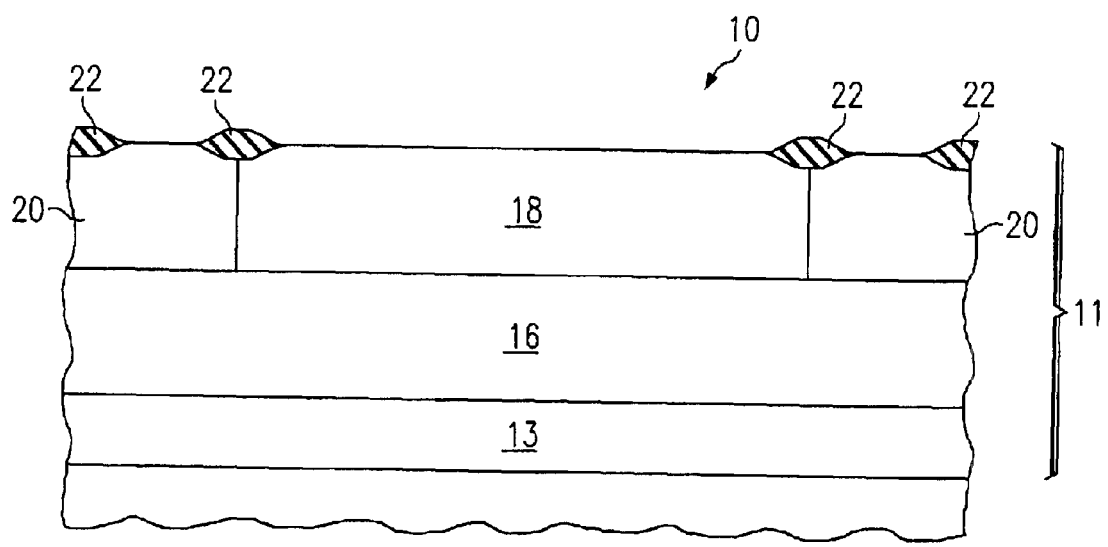
FIG. 2 is a cross-sectional diagram illustrating a semiconductor device with an active region, a buried layer and isolation structures at one stage of a manufacturing process, in accordance with a particular embodiment of the present invention.

FIG. 2 illustrates semiconductor device 10 at one stage of a manufacturing process, in accordance with an embodiment of the present invention. Semiconductor substrate 11 comprises wafer 13, which is formed from a single crystalline silicon material. Semiconductor substrate 11 may comprise other suitable materials or layers without departing from the scope of the present invention. For example, semiconductor substrate 11 may include a recrystallized semiconductor material, a polycrystalline semiconductor material or any other suitable semiconductor material.

Buried layer 16 is formed within semiconductor substrate 11 using any of a variety of techniques well known to those skilled in the art. In the illustrated embodiment, buried layer 16 is negatively-doped to form a negative buried layer ("NBL"); however, in other embodiments, buried layer 16 may either be negatively-doped to form an NBL or positively-doped to form a positive buried layer ("PBL"). In an NBL, electrons conduct electricity during operation of semiconductor device 10, while holes conduct electricity in a PBL. Any of a number of dopants may be used to form an NBL, such as arsenic or antimony; and dopants such as boron or indium may be used to form a PBL.

Active region 18 is formed adjacent buried layer 16. In the illustrated embodiment, active region 18 is a positive-type ("p-type") region; however, in other embodiments, active region 18 may be a negative-type ("n-type") region. Active region 18 may be formed by any of a variety of techniques well known to those skilled in the art, such as epitaxial deposition. Active region may have a depth of approximately 3.5 microns.

Well region 20 is formed adjacent a portion of active region 18. In the illustrated embodiment, well region 20 is a negatively-doped region ("N-well"); however, in other embodiments, well region 20 may be a positively-doped region ("P-well"). In other embodiments, well region 20 may also be a deep n-type or a deep p-type region. Well region 20 may be formed by any of a variety of techniques well known to those skilled in the art, such as high energy implantation and/or diffusion.

Isolation structures 22 of semiconductor device 10 are formed. In the illustrated embodiment, isolation structures 22 are local oxidation on silicon ("LOCOS") isolation structures; however, other embodiments of the present invention may include different types of isolation structures, such as shallow trench isolation structures. LOCOS isolation structures 22 may be conventionally formed by growing a thin pad oxide upon semiconductor substrate 11 and depositing a thin nitride layer over the pad oxide. Photoresist is spun on and lithographically patterned to define field regions in which LOCOS isolation structures 22 are formed. The thin nitride layer is etched in the field regions with the pattern photoresist as the etch mask. The pattern photoresist is stripped and LOCOS structures 22 are grown in the field regions with the pattern nitride as the oxidation barrier.

Figure 3:
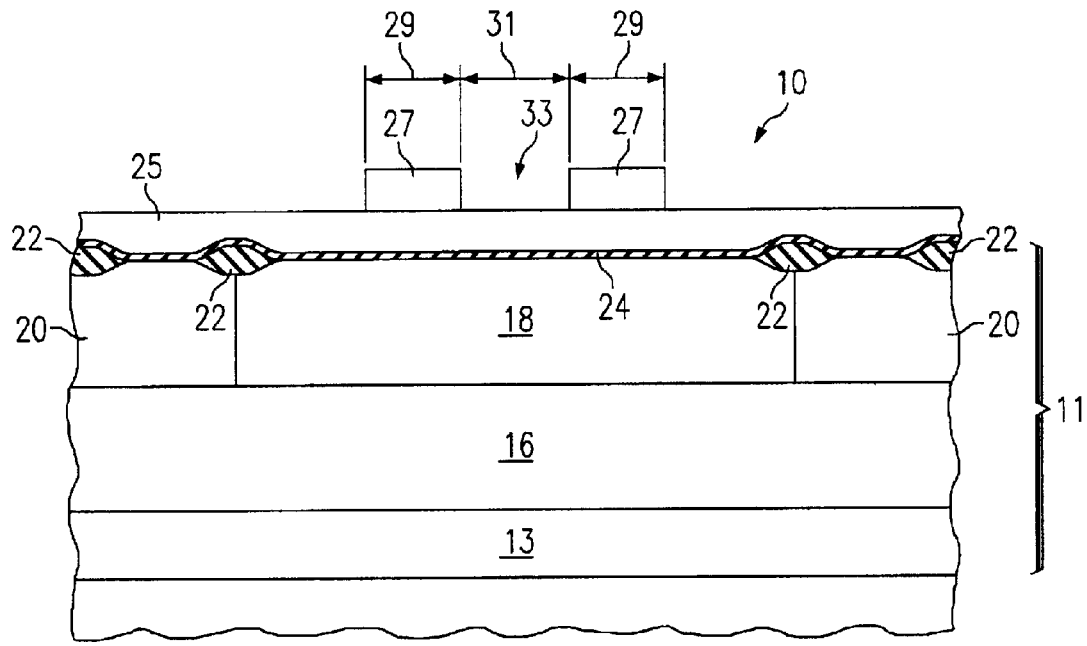
FIG. 3 is a cross-sectional diagram illustrating the semiconductor device of FIG. 2 with a polysilicon layer and a gate oxide at another stage of a manufacturing process, in accordance with a particular embodiment of the present invention.

FIG. 3 illustrates semiconductor device 10 of FIG. 2 at a further stage in the manufacturing process. A gate oxide 24 is formed upon semiconductor substrate 11 using an oxidation method known to one skilled in the art. A polysilicon layer 25 is deposited upon gate oxide 24. Such deposition may use a process used in depositing a metal oxide semiconductor (MOS) gate polysilicon, such as low pressure chemical vapor deposition (LPCVD). A mask 27 is formed upon polysilicon layer 25 above where polysilicon definition structure 26 will be subsequently patterned.

A width 29 of mask 27 will determine the distance from a subsequently formed emitter contact region to a subsequently formed base contact region (both illustrated in FIG. 4). Thus, a manufacturer can form semiconductor device 10 having a specific distance between an emitter contact region and a base contact region by controlling width 29 of mask 27.

Moreover, a width 31 of a region 33 substantially surrounded by mask 27 will determine the width of the subsequently formed emitter contact region. Thus, a manufacturer can form semiconductor device 10 having an emitter contact region with a desired width by controlling width 31 of region 33 substantially surrounded by mask 27.

Figure 4:
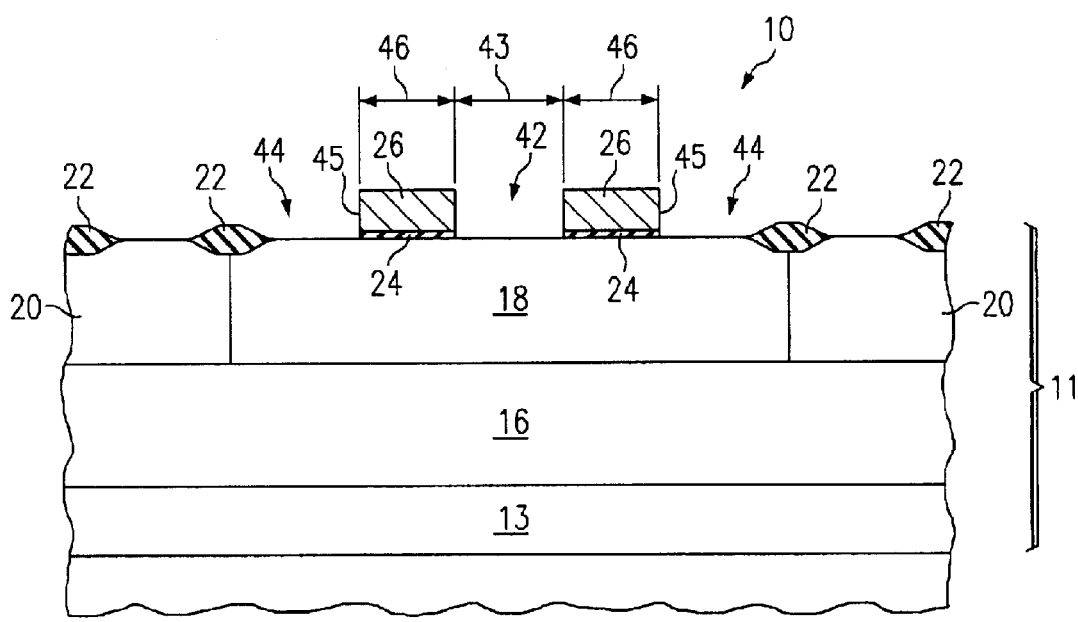
FIG. 4 is a cross-sectional diagram illustrating the semiconductor device of FIG. 3 with a polysilicon definition structure substantially surrounding an emitter contact region at another stage of a manufacturing process, in accordance with a particular embodiment of the present invention.

FIG. 4 illustrates semiconductor device 10 of FIG. 3 at a further stage in the manufacturing process. Gate oxide 24 and polysilicon layer 25 of FIG. 3 are patterned using an etching process to form polysilicon definition structure 26 disposed upon gate oxide 24. In other embodiments, polysilicon definition structure 26 may be formed using other techniques known to those skilled in that art. In a MOS technology, the formation of polysilicon definition structure may occur when forming a gate electrode of the MOS technology.

Polysilicon definition structure 26 substantially surrounds emitter contact region 42 where an emitter contact will be subsequently formed. Base contact region 44 is located approximately between an outer edge 45 of polysilicon definition structure 26 and a LOCOS isolation structure 22.

A width 43 of emitter contact region 42 can be more easily controlled and reduced during the manufacturing process through the formation of polysilicon definition structure 26. Emitter contact region 42 may have a width of approximately 0.6 microns. Furthermore, a width of polysilicon definition structure 26, defining the distance between emitter contact region 42 and base contact region 44, may be more easily controlled and reduced as well. Polysilicon definition structure 26 may have a width of approximately 0.4 to 0.6 microns.

As stated above, the reduction in the width of emitter contact region 42 and the space between emitter contact region 42 and base contact region 44 can increase the $F_t$ of semiconductor device 10. Such width and space reductions can also enhance the speed and high current performance of the device. Furthermore, packing density can be improved during manufacturing since more semiconductor devices may be able to fit on a wafer of a given size. Furthermore, base resistance ($R_b$) and junction capacitance ($C_j$) of semiconductor device 10 can be reduced as well.

Another advantage to manufacturing semiconductor device 10 with polysilicon definition structure 26 occurs during the subsequent implantation process. When a source/drain implant is made to emitter contact region 42 and base contact region 44, polysilicon definition structure 26 acts as a block and helps define the edges of the implant regions during implantation. In this regard, the implant regions are self-aligned. Therefore, just as the presence of polysilicon definition structure 26 defines emitter contact region 42, the presence of polysilicon definition structure 26 defines alignment of implant regions 28 and 30.

Furthermore, there may be no need for a silicide block to be used during silicidation of emitter contact region 42 and base contact region 44 since polysilicon definition structure 26 can act as a block during silicidation. This can reduce the number of masking steps needed during manufacturing which leads to reduced overall manufacturing time and expense.

Semiconductor device 10 having a polysilicon definition structure 26 also provides more freedom to modulate performance of the device by changing the polysilicon voltage. This can improve 1/f noise and reduce the current crowding effect. Furthermore, particular embodiments of the present invention also lead to a better collector current to base current ratio ($I_c/I_b$) at low collector current due to better interface oxide quality. Low frequency noise may improve due to better interface oxide quality. Lower base generation and recombination current are provided as well.

Referring back to FIG. 1, semiconductor device 10 of FIG. 4 is illustrated at a further stage in the manufacturing process. Source/drain implant region 28 of emitter contact region 42, source/drain implant region 30 of base contact region 44 and source/drain implant region 32 of a collector contact region 48 have been formed in accordance with techniques known to those skilled in the art. In the illustrated embodiment, implant regions 28 and 32 are $N^+$ type while implant region 30 is $P^+$ type; however, the type of implant regions in other embodiments may be different in order to work in a given technology.

Spacer structures 34 are formed adjacent edges of polysilicon definition structure 26. Spacer structures 34 comprise a nitride material; however, spacer structures in other embodiments may comprise other materials. Emitter contact 36, base contacts 38 and collector contacts 40 are also formed upon semiconductor device 10.

Other standard processing steps can be undertaken in the manufacturing of semiconductor device 10. Such processing steps may include the formation of base layers, dielectric portions, silicide portions, other implant regions and other layers and/or structures known to those skilled in the art. For example, contacts may be formed upon polysilicon definition structure 26 in order to provide another electrical contact for semiconductor device 10. In such a case, the voltage at polysilicon definition structure 26 may be controlled to modulate the performance of the device. Other appropriate metal interconnections may be formed and passivation may be undertaken. Other appropriate methods or steps may be performed to complete the manufacturing of semiconductor device 10.

Figure 5:
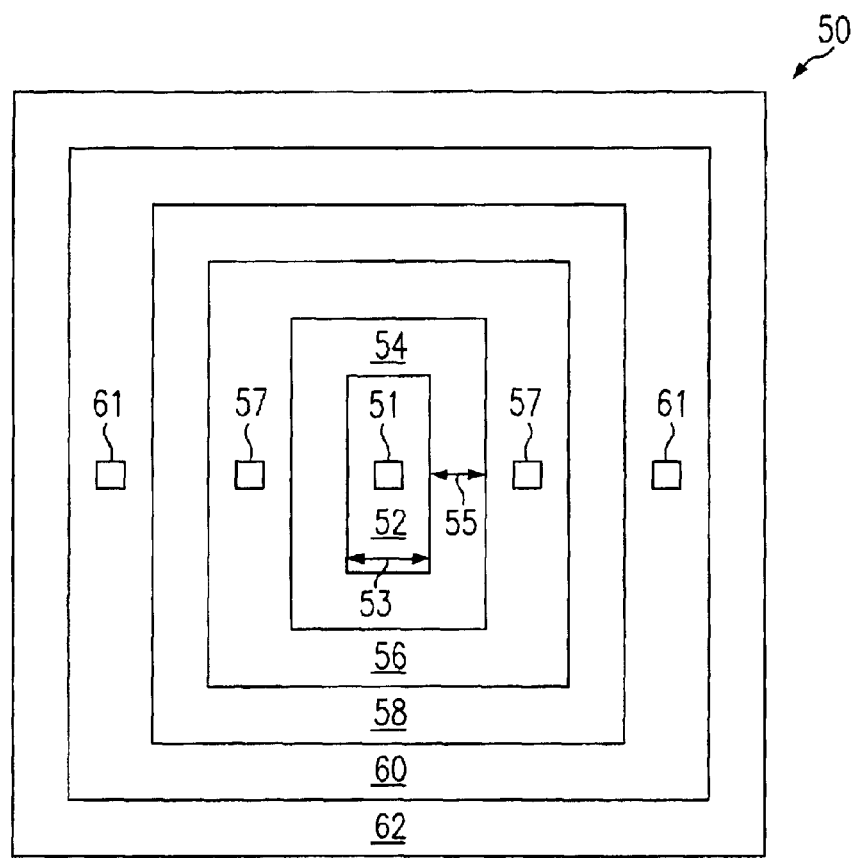
FIG. 5 is a top view illustrating a semiconductor device with a polysilicon definition structure, in accordance with a particular embodiment of the present invention.

FIG. 5 is a top view illustrating a semiconductor device 50 at one stage of a manufacturing process in accordance with an embodiment of the present invention. The formation processes of semiconductor device 10 discussed above may apply to the formation of semiconductor device 50. Semiconductor device 50 includes an emitter contact region 52 surrounded by a polysilicon definition structure 54. As stated earlier with regard to semiconductor device 10, the formation of polysilicon definition structure 54 allows a manufacturer of semiconductor device 50 to reduce and more-easily control a width 53 of emitter contact region 52 and a width 55 of polysilicon definition structure 56 during manufacturing. As a result, the advantages discussed above with regard to semiconductor device 10 may also apply to semiconductor device 50.

Emitter contact region 52 includes an emitter contact 51. Base contact region 56 is formed between polysilicon definition structure 54 and an isolation structure 58. Base contact region 56 includes base contacts 57. Collector contact region 60 surrounds isolation structure 58 and includes collector contacts 61. Isolation structure 62 surrounds collector contact region 60.

Figure 6:
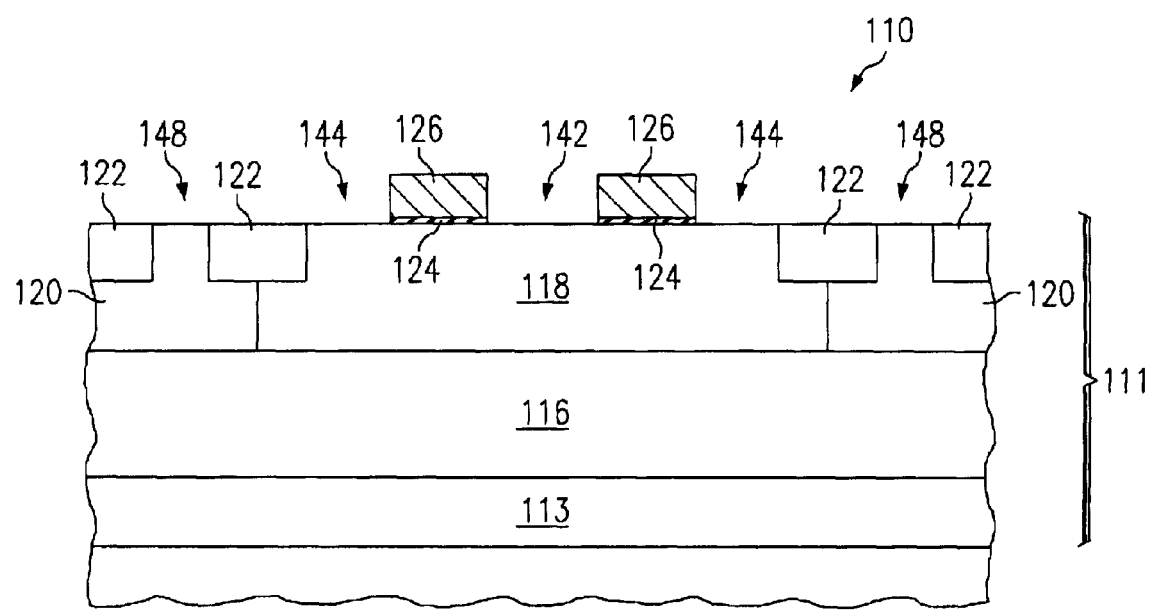
FIG. 6 is a cross-sectional diagram illustrating a semiconductor device with a polysilicon definition structure, in accordance with another embodiment of the present invention.

FIG. 6 illustrates a semiconductor device 110 in accordance with a particular embodiment of the present invention. Semiconductor device 110 is similar in some respects to semiconductor device 10 of FIGS. 1–4; however, isolation structures 122 of semiconductor device 110 are shallow trench isolation structures in this embodiment.

Shallow trench isolation structures 122 may be formed using photoresist, etching and chemical, mechanical polishing, or by any other means known to those skilled in the art. Shallow trench isolation structures 122 may be filled with a suitable insulative material, such as silicon dioxide. Such material may be deposited within shallow trench isolation structures 122 using a suitable deposition process such as chemical vapor deposition.

Semiconductor device 110 also includes a polysilicon definition structure 126 disposed upon a gate oxide 124. Polysilicon definition structure 126 substantially surrounds an emitter contact region 142. A base contact region 144 is proximate polysilicon definition structure 126. A collector contact region 148 is proximate shallow trench isolation structures 122. Semiconductor substrate 111 of semiconductor device 110 includes a wafer 113, a buried layer 116, an active region 118 and a well region 120.

The illustrated embodiments incorporate embodiments of the invention in a bipolar technology. Particular embodiments of the present invention may be incorporated into MOS, complementary metal oxide semiconductor (CMOS) and bipolar complementary metal oxide semiconductor (BiCMOS) technologies as well. In such cases, other processes or steps may be undertaken to complete the manufacturing process. For example, in a standard MOS technology, threshold voltage implants may be formed. Other technologies known to those of skilled in the art may utilize particular embodiments of the present invention as well.

Although particular configurations and methods have been illustrated for particular embodiments of the present invention, other embodiments may include other configurations and/or methods. The present invention has been described in detail; however, various changes and modifications may be suggested to one skilled in the art. It is intended that the present invention encompass such changes and modifications as falling within the scope of the appended claims.

What is claimed is:

1. A method for manufacturing a semiconductor device, comprising:

forming a buried layer of a semiconductor substrate;

forming an active region adjacent at least a portion of the buried layer;

forming an isolation structure adjacent at least a portion of the active region;

forming a gate oxide adjacent at least a portion of the active region;

forming a polysilicon layer adjacent at least a portion of the gate oxide;

removing at least a portion of the polysilicon layer to form a polysilicon definition structure, wherein the polysilicon definition structure at least substantially surrounds and defines an emitter contact region;

forming an implant region of the emitter contact region, wherein the implant region is self-aligned; and forming an implant region of a base contact region, wherein the base contact region is adjacent at least a portion of the polysilicon definition structure.

2. The method of claim 1, wherein removing at least a portion of the polysilicon layer to form a polysilicon definition structure comprises:

masking a first portion of the polysilicon layer, leaving a second portion of the polysilicon layer unmasked; and removing the second portion of the polysilicon layer.

3. The method of claim 1, wherein a width of the polysilicon definition structure is approximately 0.4 to 0.6 microns.

4. The method of claim 1, wherein a width of the emitter contact region is approximately 0.6 microns.

5. The method of claim 1, wherein the isolation structure comprises a local oxidation on silicon (LOCOS) isolation structure.

6. The method of claim 1, wherein the isolation structure comprises a shallow trench isolation (STI) structure.

7. The method of claim 1, wherein the active region has a depth of approximately 3.5 microns.

8. The method of claim 1, further comprising forming an emitter contact at the emitter contact region.

9. The method of claim 1, further comprising forming one or more spacer structures adjacent the polysilicon definition structure.

10. The method of claim 1, wherein the spacer structures comprise a nitride.

* * * * *